US012757739B2

(12) United States Patent
Darmawikarta et al.

(10) Patent No.: US 12,757,739 B2
(45) Date of Patent: Oct. 6, 2026

(54) PACKAGE SUBSTRATE WITH OPEN AIR GAP STRUCTURES

(71) Applicant: Intel Corporation, Santa Clara, CA (US)

(72) Inventors: Kristof Kuwawi Darmawikarta, Chandler, AZ (US); Cemil S. Geyik, Gilbert, AZ (US); Kemal Aygun, Tempe, AZ (US); Tarek A. Ibrahim, Mesa, AZ (US); Wei-Lun Jen, Phoenix, AZ (US); Zhiguo Qian, Chandler, AZ (US); Dilan Seneviratne, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 17/937,474

(22) Filed: Oct. 3, 2022

(65) Prior Publication Data

US 2024/0113049 A1 Apr. 4, 2024

(51) Int. Cl.

*H10W 44/20* (2026.01)
*H10W 70/60* (2026.01)
*H10W 70/65* (2026.01)
*H10W 70/685* (2026.01)
*H10W 70/69* (2026.01)
*H10W 70/05* (2026.01)
*H10W 90/00* (2026.01)

(52) U.S. Cl.

CPC .......... *H10W 44/20* (2026.01); *H10W 70/611* (2026.01); *H10W 70/65* (2026.01); *H10W 70/685* (2026.01); *H10W 70/69* (2026.01); *H10W 44/209* (2026.01); *H10W 44/216* (2026.01); *H10W 70/095* (2026.01); *H10W 90/00* (2026.01)

(58) Field of Classification Search

CPC ............... H01L 23/66; H01L 23/49822; H01L 23/49838; H01L 23/49894; H01L 23/5383; H01L 23/5386; H10W 44/20; H10W 70/685; H10W 70/65; H10W 70/69; H10W 70/611

See application file for complete search history.

(56) References Cited

U.S. PATENT DOCUMENTS

2020/0203256 A1* 6/2020 Neal ................. H01L 23/49827
2023/0068082 A1* 3/2023 Lin ................... H01L 23/49822
2023/0395519 A1* 12/2023 Yew ................... H01L 23/3121

* cited by examiner

*Primary Examiner* — Michael Jung
(74) *Attorney, Agent, or Firm* — Akona IP PC

(57) ABSTRACT

Embodiments of a microelectronic assembly that includes: a package substrate, comprising buildup layers of an organic dielectric material and a plurality of layers of conductive traces in the organic dielectric material, the package substrate having a first surface and a second surface opposite the first surface; and a plurality of integrated circuit (IC) dies coupled to the package substrate on the first side. The plurality of layers of conductive traces comprises a pair of stripline traces or microstrips in one of the layers, the stripline traces or microstrips are surrounded by air gap structures in the organic dielectric material, and the air gap structures are exposed on the first surface.

18 Claims, 7 Drawing Sheets

PACKAGE SUBSTRATE WITH OPEN AIR GAP STRUCTURES

TECHNICAL FIELD

The present disclosure relates to techniques, methods, and apparatus directed to a package substrate with open air gap structures.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
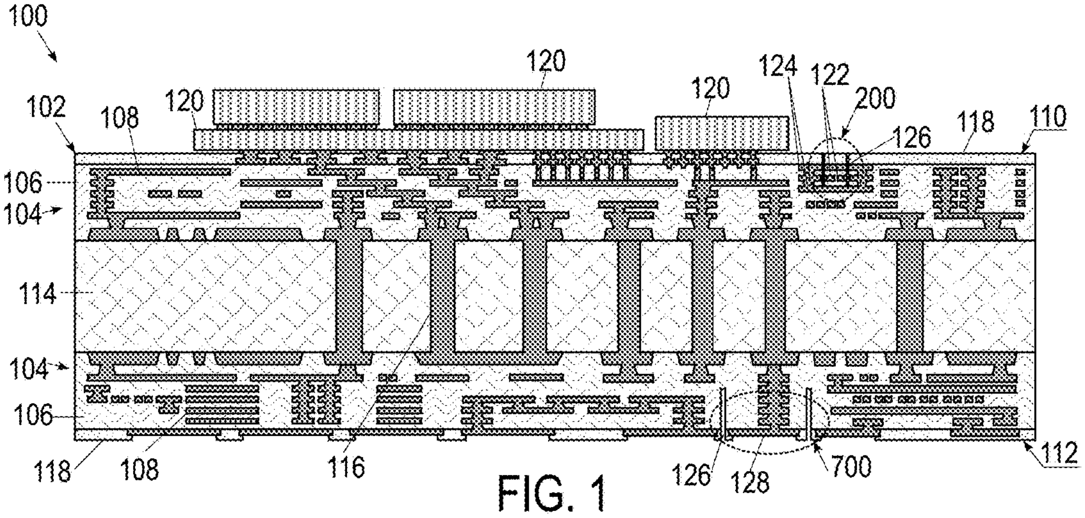
FIG. 1 is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The trend in the computer industry is to utilize multiple processors in large servers, the multiple processors being coupled together in a single package, such as a Multi-Chip Module (MCM). The multiple processors along with other IC dies containing memory circuits (e.g., cache memory circuits, high-bandwidth memory circuits, etc.) are interconnected by high-speed data buses in the package substrate of the MCM, for example, to enable the totality of processors to operate together. Copper interconnect technology is typically used to fabricate these high-speed data buses, but the technology is inherently limited in its ability to scale to the bandwidth/distance requirements of next generation servers. These limitations are primarily associated with signal loss and distortion in the electrical transport media and bandwidth reduction due to skin effect at high data transmission rates.

Further, demand for higher data rate is driving signal speeds in ICs to values greater than 10 GHz. Signals having speeds greater than 10 GHz are considered as high-speed signals. Achieving such high speeds is a challenge in typical package substrates, which are composed of layers of dielectric material with conductive traces between the layers and conductive vias through the layers. In such structures, high-speed signals propagating through the conductive traces and vias experience loss dependent on the dielectric constant of the dielectric material, and the geometry (e.g., width, length, thickness, shape, etc.) of the conductive traces.

As the demand for higher data rates continues to increase, losses in package substrates increase proportionately unless minimized using non-conventional techniques. In a general sense, signal loss in the forms of insertion loss (simply referred to as "loss" herein) in package substrates, has two major components, considering that radiation loss is negligible in high-speed interconnects: i) dielectric loss, and ii) conductor loss (i.e., loss due to the dielectric surrounding the signal conductor, also called "conductor trace," "trace," or "transmission line" interchangeably herein, and loss due to the transmission line itself). Dielectric loss is independent of the topology and depends only on the dielectric materials. It is proportional to the dissipation factor (Df) of the dielectric material, root of dielectric constant (Dk) of the dielectric material and frequency of the high-speed signals. Thus, one approach to facilitate lower loss is to use dielectric materials with lower Dk. To this end, introduction of new dielectrics and adhesion promotion techniques have been key enablers as technology building blocks for lower loss and higher bandwidth. Material suppliers have been continuously improving their processes and chemistries to reduce the dielectric constant, dissipation factor (e.g., loss tangent) and surface roughness, while providing strong adhesion to the dielectric materials.

Conductor loss can be split into two factors: i) surface roughness induced loss, and ii) bulk conductor loss. Unlike dielectric loss, conductor loss depends on the design rules, shape, and dimensions of the transmission line conducting the high-speed signals. Thus, today's on-package high-speed interconnect loss is largely dominated by bulk conductor loss due to shrinking cross-sectional dimensions (e.g., thinner substrates, small traces, etc.). This dominant factor can be reduced by optimizing transmission line designs for a low-resistance conductor. Yet, due to various other design considerations such as trace topology, available routing space, etc., it may not be possible to optimize conductive traces solely for reduced loss. Package traces for high-frequency signals (e.g., greater than 10 GHz) are typically structured as a stripline, where the signal(s) traces are sandwiched between ground/reference planes with an insulating dielectric to separate the layers. One option to reduce the loss is to use a dielectric with low dielectric constant D k and low loss tangent Df. However, there is a lower limit to the organic dielectric properties of substrate-compatible epoxy-based dielectric material. One alternative to realize effective lower D k is to have air gap structures near high-speed interconnects.

Further, second-level interconnects (SLI) in such package substrates for high-frequency signals suffer from parasitic capacitance to the nearby ground plane. Traditionally, larger copper void around the SLI landing pad has been employed to reduce such parasitic capacitance. However, there is a limit above which copper voiding can be detrimental to the plating and dielectric thickness uniformity. In such scenarios also, an air gap structure can reduce the effective $D_k$, thereby decreasing the capacitance. Indeed, air gap structures between or around the signal traces structures may improve insertion loss up to 25%. However, it is risky structurally, and for reliability, to have air gap structures or voids that are trapped and sealed in the package substrate, especially during reliability cycle test.

Accordingly, embodiments described herein enable a microelectronic assembly that includes: a package substrate, comprising buildup layers of an organic dielectric material and a plurality of layers of conductive traces in the organic dielectric material, the package substrate having a first surface and a second surface opposite the first surface; and a plurality of IC dies coupled to the package substrate on the first side. The plurality of layers of conductive traces comprises a pair of stripline traces in one of the layers, the stripline traces are surrounded by air gap structures in the organic dielectric material, and the air gap structures are exposed on the first surface.

Some embodiments of a package substrate as disclosed herein comprises: an organic dielectric material; a conductive trace in the organic dielectric material; a first air gap structure; and a second air gap structure laterally parallel to the first air gap structure. The conductive trace is proximate and parallel to a surface of the package substrate, the conductive trace is between the first air gap structure and the second air gap structure, the first air gap structure and the second air gap structure are exposed on the surface of the package substrate, and the first air gap structure and the second air gap structure extend orthogonal to the surface of package substrate into the organic dielectric material.

In some embodiments disclosed herein, the package substrate comprises an organic dielectric material; a conductive bond-pad on a surface of the package substrate; and an air gap structure surrounding the conductive bond-pad. The air gap structure is exposed on the surface of the package substrate, and the air gap structure extends orthogonal to the surface of package substrate into the organic dielectric material.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "optical structure" includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In many embodiments, an FET is a four-terminal device. In SOI, or nanoribbon, or gate all-around (GAA) FET, the FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term “interconnect.” The nature of the interconnect being described is to be understood herein with reference to the signal medium associated therewith. Thus, when used with reference to an electronic device, such as an IC that operates using electrical signals, the term “interconnect” describes any element formed of an electrically conductive material for providing electrical connectivity to one or more elements associated with the IC or/and between various such elements. In such cases, the term “interconnect” may refer to both conductive traces (also sometimes referred to as “lines,” “wires,” “metal lines” or “trenches”) and conductive vias (also sometimes referred to as “vias” or “metal vias”). Sometimes, electrically conductive traces and vias may be referred to as “conductive traces” and “conductive vias”, respectively, to highlight the fact that these elements include electrically conductive materials such as metals. Likewise, when used with reference to a device that operates on optical signals as well, such as a photonic IC (PIC), “interconnect” may also describe any element formed of a material that is optically conductive for providing optical connectivity to one or more elements associated with the PCI. In such cases, the term “interconnect” may refer to optical waveguides, including optical fiber, optical splitters, optical combiners, optical couplers, and optical vias.

The term “waveguide” refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term “conductive trace” may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term “conductive via” may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term “microstrip” and “stripline” refer to conductive traces that are used to convey relatively high-frequency signals (e.g., greater than 10 GHz frequency) such that the traces may be considered to act like transmission lines. The microstrip is a simple structure involving a conductive trace, a single ground plane, and a dielectric layer (e.g., the package substrate) separating the trace and the ground plane. A simple microstrip is located on the top of a PCB or package substrate (or other like structures and/or components), and an embedded microstrip surrounded by the dielectric material of the PCB or package substrate (or other like structures and/or components). The stripline is similar to a microstrip, except that the trace is embedded in the dielectric layer of the PCB or package substrate (or other like structures and/or components), which is itself sandwiched between two ground planes. In the case of a symmetric stripline, the trace is equidistant from the two ground planes. In the case of an asymmetric stripline, the trace is closer to one or other of the ground planes. A pair of stripline traces may be routed in parallel to each other. These are referred to as edge-coupled when the striplines are located side-by-side, and broadside-coupled when one is placed above the other.

The term “package substrate” may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term “metallization stack” may be used to refer to a stack of one or more interconnects for providing connectivity to different circuit components of an IC die/chip and/or a package substrate.

As used herein, the term “pitch” of interconnects refers to a center-to-center distance between adjacent interconnects.

In context of a stack of dies coupled to one another or in context of a die coupled to a package substrate, the term “interconnect” may also refer to, respectively, die-to-die (DTD) interconnects and die-to-package substrate (DTPS) interconnects. DTD interconnects may also be referred to as first-level interconnects (FLI). DTPS interconnects may also be referred to as SLI.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
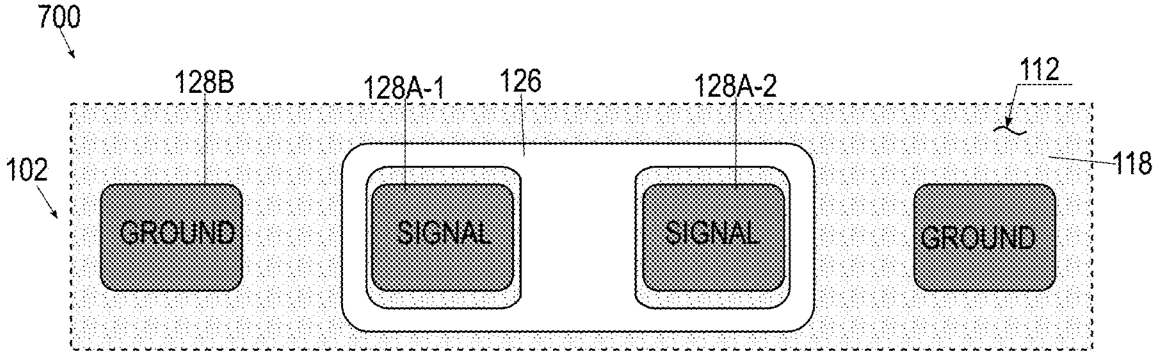
FIG. 10 is a schematic top view of a portion of yet another example microelectronic assembly according to some embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of an example microelectronic assembly 100 according to some embodiments of the present disclosure. Microelectronic assembly 100 comprises a package substrate 102, comprising buildup layers 104 of an organic dielectric material 106 and a plurality of layers of conductive traces 108 in organic dielectric material 106. In various embodiments, organic dielectric material 106 may comprise polyimide; in some other embodiments, organic dielectric material 106 may comprise buildup film, such as epoxy-based dry film or other materials as described in reference to package substrates in the previous subsection. Package substrate 102 has a surface 110 and a surface 112 opposite surface 110. In some embodiments (e.g., as shown), package substrate 102 further comprises a core 114, with buildup layers 104 on opposite sides of core 114. Core 114 may comprise fiber reinforced epoxy in some embodiments. In other embodiments, core 114 may comprise inorganic materials, such as glass or ceramic. Plated through-hole vias 116 through core 114 conductively couple conductive traces 108 in the two buildup layers 104 on either side of core 114. In various embodiments, package substrate 102 may further comprise solder resist 118 on surfaces 110 and 112. A plurality of IC dies 120 may be coupled to package substrate 102 on surface 110.

In various embodiments, plurality of layers of conductive traces 108 comprises a pair of stripline traces 122 in one of the layers proximate to surface 110. Stripline traces 122 may be configured to conduct high-speed input/output (HSIO) signals in frequencies greater than 10 GHz in microelectronic assembly 100. Stripline traces 122 may be sandwiched between ground planes 124. Stripline traces 122 may be surrounded by air gap structures 126 exposed on (e.g., visible on, open to, etc.) surface 110. In various embodiments, air gap structures 126 may extend through solder resist 118 and organic dielectric material 106. In some embodiments, air gap structures 126 may comprise open blind vias terminating in organic dielectric material 106; in other embodiments, air gap structures 126 may comprise open blind vias terminating in one or more conductive traces 108. In some embodiments air gap structures 126 may extend past a single layer of conductive traces 108; in other embodiments, air gap structures 126 may extend past several individual layers of conductive traces 108.

Figure 2:
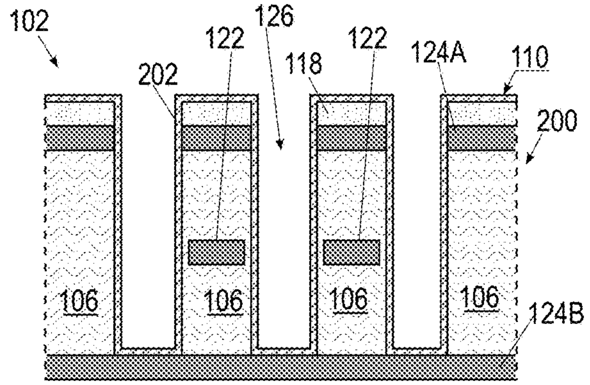
FIG. 2 is a schematic cross-sectional view of a portion of an microelectronic assembly according to some embodiments of the present disclosure.

FIG. 2 is a schematic cross-sectional view of a portion 200 of microelectronic assembly 100 around air gap structures 126 proximate to surface 110 according to some embodiments of the present disclosure. In the embodiment shown, exposed surfaces of air gap structures 126 may be coated with a passivation layer 202. In various embodiments, passivation layer 202 may comprise silicon nitride. Separate portions of passivation layer 202 may contact organic dielectric material 106, solder resist 118, and conductive traces 108. Conductive traces 108 may comprise stripline traces 122 and ground planes 124. In the embodiment shown in the figure, stripline traces 122 are arranged as edge-coupled, being mutually laterally adjacent and conductively coupled to a high-frequency signal connection. Ground planes 124 may comprise conductive plates conductively coupled to a ground connection. In some embodiments (as shown), ground planes 124 in layers adjacent to the layer with stripline traces 122 such that stripline traces 122 are between the two ground planes 124A and 124B. In the embodiment shown, ground plane 124A is closer to surface 110 than ground plane 124B.

Air gap structures 126 may be arranged around and parallel to stripline traces 122, extending orthogonal to surface 110 of package substrate 102 into organic dielectric material 106. Air gap structures 126 are arranged as a plurality of open blind vias in rows parallel to and longitudinal with stripline traces 122. Air gap structures 126 may extend through ground plane 124A and terminate at ground plane 124B past the layer comprising stripline traces 122. Thus, air gap structures 126 extend past a single layer of ground plane 124A and another single layer of stripline traces 122. At least one of stripline traces 122 may be between adjacent air gap structures 126. In the figure, a sliver of organic dielectric material 106 is shown between stripline traces 122 and air gap structure 126; note that such is merely for ease of illustration; in practice, the sliver may be absent (e.g., stripline traces 122 may contact passivation layer 202) or may be thicker than suggested in the figure. In some embodiments, air gap structures 126 may be surrounded by organic dielectric material 106; in some other embodiments, air gap structures 126 may be surrounded by organic dielectric material 106 and solder resist 118. In various embodiments, air gap structures 126 are approximately between 10 micrometers to 100 micrometers wide. A thickness of organic dielectric material 106 between surface 110 of the package substrate and the stripline traces is approximately between 60 micrometers to 80 micrometers.

The presence of air gap structures 126 between and around stripline traces 122 may serve to decrease the effective dielectric constant of organic dielectric material 106 in regions proximate to stripline traces 122. Further, air gap structures 126 are exposed on surface 110, thereby eliminating any reliability issues in comparison with an alternate arrangement in which potential air pockets are trapped inside organic dielectric material 106.

Figure 3:
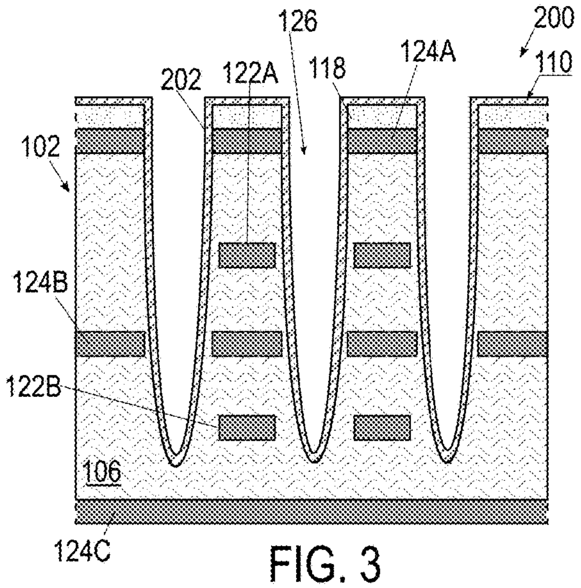
FIG. 3 is a schematic cross-sectional view of a portion of another microelectronic assembly according to some embodiments of the present disclosure.

FIG. 3 is a schematic cross-sectional view of a portion 200 of another microelectronic assembly 100 around air gap structures 126 proximate to surface 110 according to some embodiments of the present disclosure. The embodiment shown in FIG. 3 is similar to that of FIG. 2 except that air gap structures 126 extend past more than one layer of ground plane 124 and stripline traces 122. For example, conductive traces 108 comprise several ground planes 124A, 1246 and 124C, all of which are shaped as conductive plates and are conductively coupled to a ground connection. Conductive traces 108 also comprise several layers of stripline traces 122, for example 122A and 122B. Stripline traces 122A are sandwiched between ground planes 124A and 12413; stripline traces 1226 are sandwiched between ground planes 1246 and 124C. Air gap structures 126 extend through ground planes 124A and 1246 past stripline traces 122A and 122B, terminating in organic dielectric material 106. In some other embodiments, air gap structures 126 may extend up to ground plane 124C.

Figure 4A:
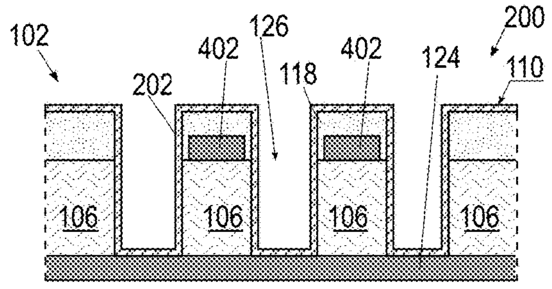
FIGS. 4A and 4B are schematic cross-sectional views of a portion of another microelectronic assembly according to different embodiments of the present disclosure.
Figure 4B:
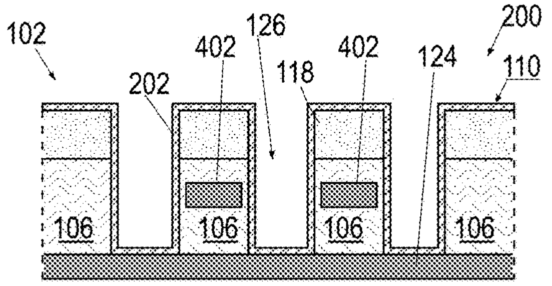

FIGS. 4A and 4B are schematic cross-sectional views of portion 200 of another microelectronic assembly 100 around air gap structures 126 proximate to surface 110 according to different embodiments of the present disclosure. Conductive traces 108 may comprise microstrips 402 on a surface of organic dielectric material 106. As noted in the previous subsection, the difference between a microstrip and stripline trace is the absence of a ground plane above the microstrip. Thus, in the embodiment shown in the figure, air gap structures 126 do not perforate or extend through any ground plane 124. Microstrips 402 are closer to surface 110 than ground plane 124. Further, microstrips 402 may be covered by solder resist 118 in some embodiments such that microstrips 402 may be considered to be "in" solder resist 118, and separated from ground plane 124 by another material, namely organic dielectric material 106. In another embodiment, as shown in FIG. 4B, microstrips 402 may be embedded microstrips, being located inside (e.g., surrounded by) organic dielectric material 106 with air gap structures 126 extending around microstrips 402 through organic dielectric material 106.

Figure 5A:
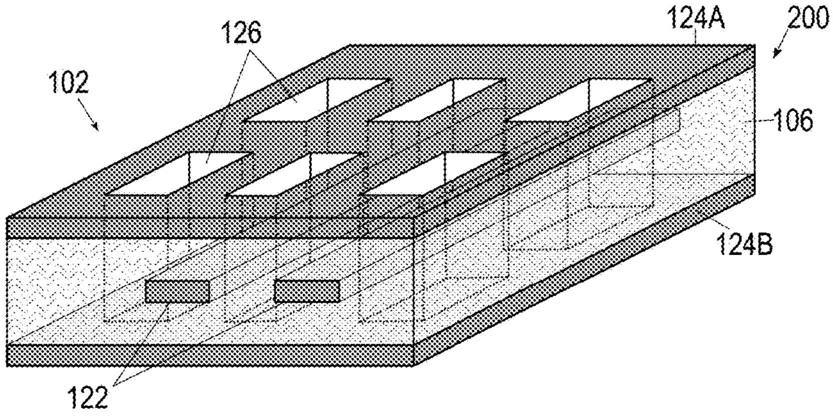
FIG. 5A is a schematic perspective view of a portion of yet another microelectronic assembly according to different embodiments of the present disclosure.
Figure 5B:
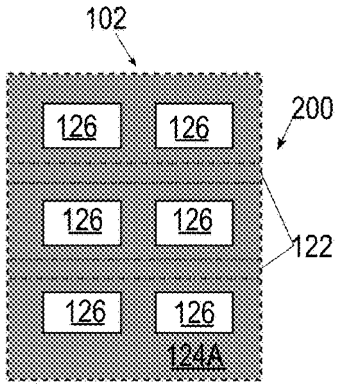
FIG. 5B is a schematic top view of the structures shown in FIG. 5A.

FIG. 5A is a schematic perspective view of portion 200 of yet another microelectronic assembly 100 around air gap structures 126 proximate to surface 110 according to different embodiments of the present disclosure. In the figure, only the region between and including ground planes 124A and 1246 is shown. In various embodiments, air gap structures 126 may comprise a plurality of open blind vias arranged in rows (and columns) parallel to stripline traces 122 and extending along respective lengths of stripline traces 122. Air gap structures 126 may extend through ground plane 124A, resulting in a perforated structure, for example, like a mesh, or slotted structures, for ground plane 124A in a region proximate to stripline traces 122. Air gap structures 126 may terminate at ground plane 124 without perforating it in some embodiments. In other embodiments, air gap structures 126 may terminate in organic dielectric material 106. FIG. 5B is a schematic top view of the structures shown in FIG. 5A. Stripline traces 122 are shown as dotted lines suggesting their placement underneath ground plane 124 in the orientation of the figure. Note that although the structures shown in the figure are similar to those of FIG. 2, other embodiments as shown in other figures may also encompass air gap structures 126 having similar open blind vias.

Figure 6:
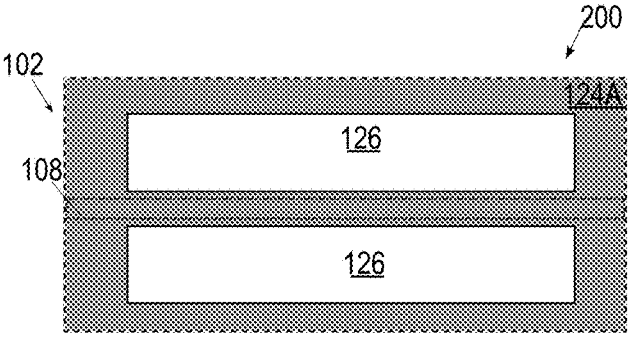
FIG. 6 is a schematic top view of a portion of a yet another microelectronic assembly according to different embodiments of the present disclosure.

FIG. 6 is a schematic top view of portion 200 of a yet another microelectronic assembly 100 around air gap structures 126 proximate to surface 110 according to different embodiments of the present disclosure. Air gap structures 126 may comprise open trench vias extending partially along respective lengths of one or more conductive trace 108. Note that the difference between the embodiment shown in the figure compared to the one in the previous figure is merely one of degree in respect to the length (or shape) of air gap structures 126, Conductive trace 108 may comprise stripline trace 122 or microstrip 402 within the broad scope of the embodiments.

Figure 7:
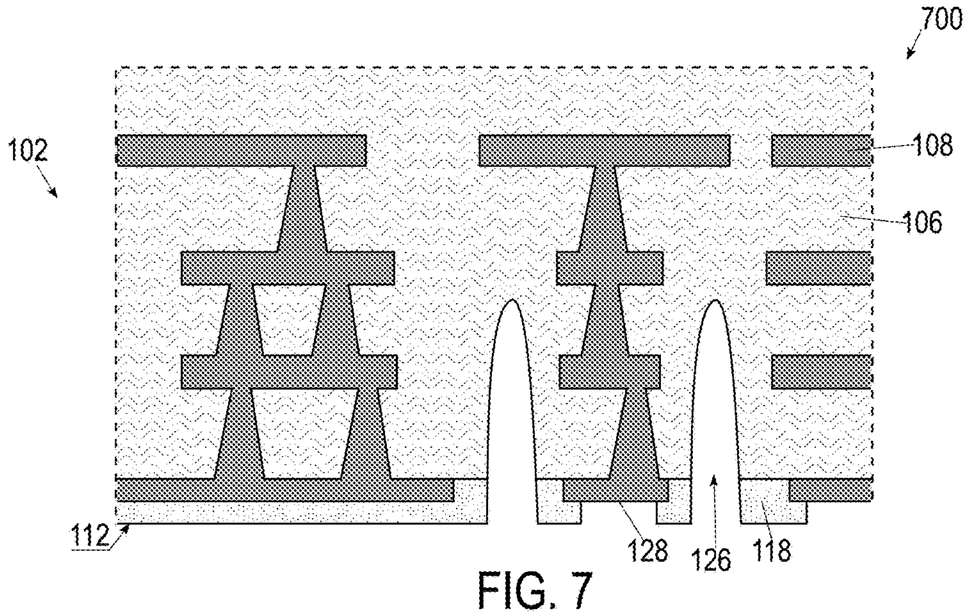
FIG. 7 is a schematic cross-sectional view of a portion of another example microelectronic assembly according to some embodiments of the present disclosure.

FIG. 7 is a schematic cross-sectional view of a portion 700 of another example microelectronic assembly 100 around air gap structures 126 proximate to surface 112 according to some embodiments of the present disclosure. Bond-pads 128 may be located on surface 112 of package substrate 102. Portions of bond-pads 128 may be covered by solder resist 118; likewise solder resist 118 may be provisioned between adjacent bond-pads 128 as well. Air gap structures 126 exposed on surface 112 may surround at least a subset of bond-pads 128. In various embodiments, air gap structures 126 may be exposed through solder resist 118 and may extend orthogonal to surface 112 into solder resist 118 and organic dielectric material 106. In some embodiments, air gap structures 126 extend past several ones of the plurality of layers of conductive traces 108 into organic dielectric material 106. In the embodiment of the figure, air gap structures 126 are open blind vias terminating in organic dielectric material 106. Note that unlike in the air gap structures 126 proximate to surface 110, air gap structures 126 proximate to surface 112 may not be covered by any passivation layer.

Figure 8:
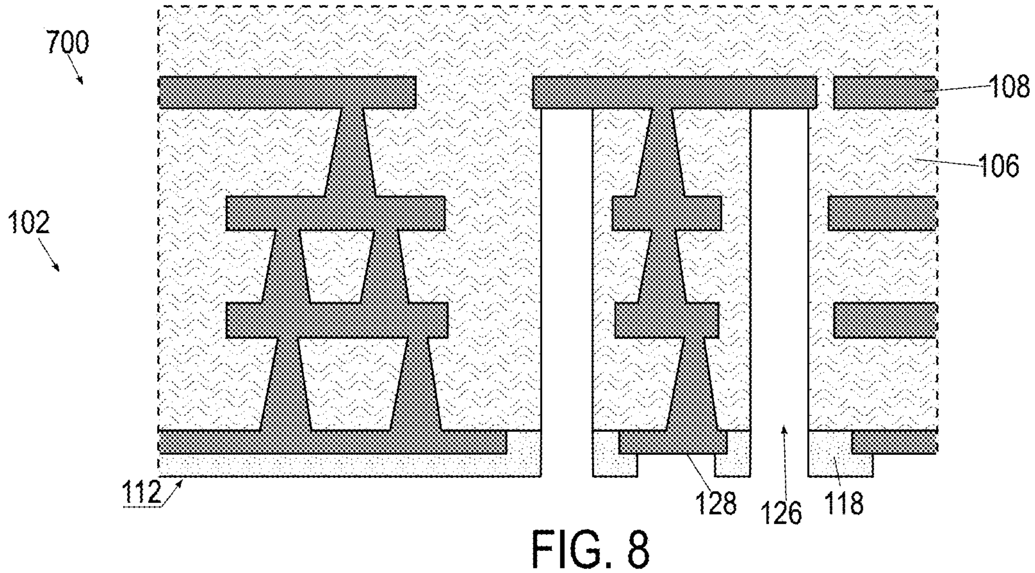
FIG. 8 is a schematic cross-sectional view of a portion of yet another example microelectronic assembly according to some embodiments of the present disclosure.

FIG. 8 is a schematic cross-sectional view of portion 700 of another example microelectronic assembly 100 around air gap structures 126 proximate to surface 112 according to some embodiments of the present disclosure. The embodiment of the figure is substantially similar to that shown in the preceding figure, except that air gap structures 126 terminate at one or more conductive traces 108.

Figure 9:
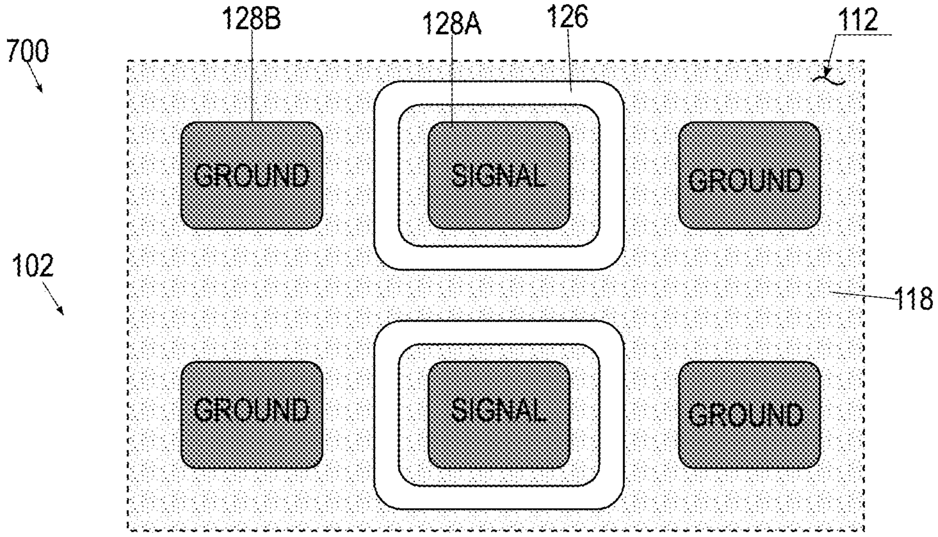
FIG. 9 is a schematic top view of a portion of another example microelectronic assembly according to some embodiments of the present disclosure.

FIG. 9 is a schematic top view of portion 700 of another example microelectronic assembly 100 around air gap structures 126 proximate to surface 112 according to some embodiments of the present disclosure. Air gap structures 126 may be shaped as ring shaped structures around individual bond-pads 128 in some embodiments. In some other embodiments, air gap structures 126 may be shaped as partial rings around individual bond-pads 128. In yet other embodiments, air gap structures 126 may be shaped as slots adjacent to individual bond-pads 128. Not all bond-pads 128 may be surrounded by air gap structures 126. In various embodiments, some bond-pads 128A that are surrounded by air gap structures 126 may be conductively coupled to high-frequency signal connections. Such bond-pads 128A conductively coupled to signal connections may be surrounded by (or be adjacent to) other bond-pads 1286 that are conductively coupled to a ground connection. Such adjacent bond-pads 1286 conductively coupled to the ground connection may not be surrounded by air gap structures 126. Note that although a rectangular ring shape is shown, other embodiments may include circular rings or polygonal rings without departing from the scope of the present disclosure. Air gap structures 126 may lower the effective dielectric constant of organic dielectric material 106 and solder resist 118 in a region proximate to bond-pads 128A.

FIG. 10 is a schematic top view of portion 700 of yet another example microelectronic assembly 100 around air gap structures 126 proximate to surface 112 according to some embodiments of the present disclosure. In the embodiment shown in the figure, two bond-pads 128, namely 128A-1 and 128A-2 are conductively coupled to signal connections and are adjacent to each other. Such bond-pads 128A-1 and 128A-2, for example, may be conductively coupled to stripline traces 122 for differential signaling. Such bond-pads 128A-1 and 128-2 may be adjacent to (or surrounded by) other bond-pads 1286 that are conductively coupled to a ground connection. Bond-pads 128A-1 and 128A-2 that are adjacent to each other and conductively coupled to signal connections may be surrounded by a single air gap structure 126 that encloses both bond-pads 128A-1 and 128A-2. Note that in practice, a portion of organic dielectric material 106 or solder resist 118 may be present between bond-pads 128 and air gap structures 126 although such portion may be absent also within the broad scope of the embodiments. Note that although a rectangular ring shape is shown, other embodiments may include circular rings or polygonal rings without departing from the scope of the present disclosure.

In various embodiments, any of the features discussed with reference to any of FIGS. 1-10 herein may be combined with any other features to form a package with one or more IC dies as described herein. For example, in some microelectronic assemblies, some IC dies may be coupled by interconnects having solder and other IC dies may be coupled by non-solder bonds. Some such combinations are described above, but, in various embodiments, further combinations and modifications are possible. Various different embodiments described in different figures may be combined suitably based on particular needs within the broad scope of the embodiments.

Example Methods

Figure 11:
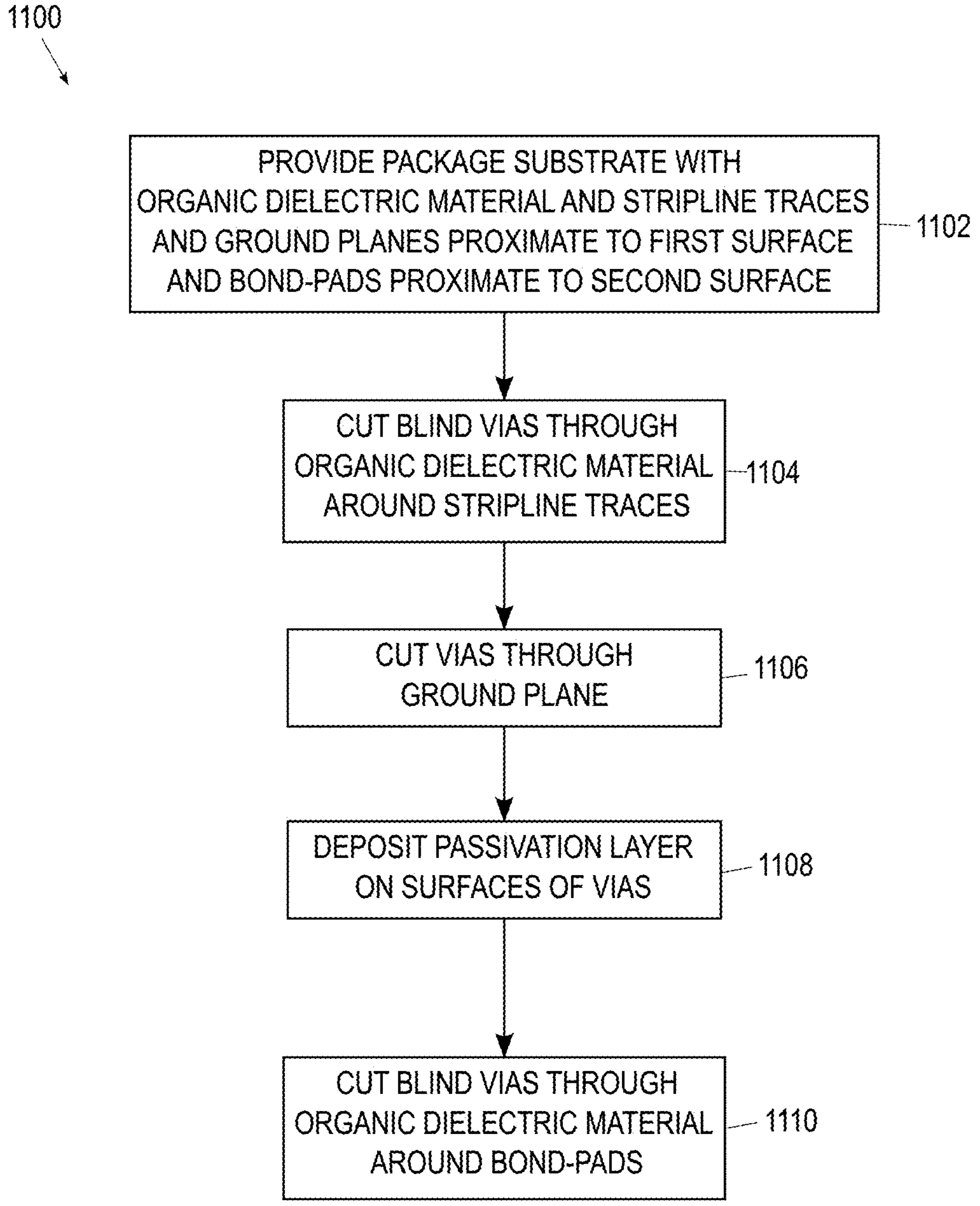
FIG. 11 is a simplified flow diagram illustrating various operations that may be associated with manufacturing an example microelectronic assembly, according to various embodiments.

FIG. 11 is a schematic flow diagram of example operations 1100 that may be associated with manufacture of microelectronic assembly 100 according to some embodiments of the present disclosure. At 1102, package substrate 102 may be provided. As described in the preceding figures, package substrate 102 includes organic dielectric material 106, stripline traces 122 (and/or microstrip 402), ground planes 124 proximate to surface 110 and bond-pads 128 proximate to surface 112. At 1104, a first set of blind vias through organic dielectric material 106 and solder resist 118 may be cut around stripline traces 122 (and/or microstrips 402). In some embodiment, the open blind vias may be cut using laser drilling. In another embodiment, the open blind vias may be cut using photolithographic etching. Any suitable process may be used to generate the open blind vias without departing from the scope of the embodiments. In some embodiments (for example, as shown in FIGS. 2, 3, 5, etc.) at 1106, vias may be cut through at least one ground plane 124A. In some other embodiments (e.g., FIG. 3), vias may be cut through more than one ground plane 124 (e.g., 124A, 124B). At 1108, passivation layer 202 may be deposited on surfaces of the open blind vias to complete air gap structures 126 proximate to surface 110. In some embodiments, passivation layer 202 may be deposited by physical vapor deposition (PVD); in other embodiments, passivation layer 202 may be deposited by chemical vapor deposition (CVD). Any suitable method may be used to deposit passivation layer 202 without departing from the scope of the embodiments. At 1110, a second set of blind vias may be cut around bond-pads 128 on surface 112 of package substrate 102. In some embodiment, the open blind vias may be cut using laser drilling. In another embodiment, the open blind vias may be cut using photolithographic etching. Any suitable process may be used to generate the open blind vias without departing from the scope of the embodiments.

Although FIG. 11 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 11 may be modified in accordance with the present disclosure to fabricate others of microelectronic assembly 100 disclosed herein. Although various operations are illustrated in FIG. 11 once each, the operations may be repeated as often as desired. For example, one or more operations may be performed in parallel to manufacture and test multiple microelectronic assemblies substantially simultaneously. In another example, the operations may be performed in a different order to reflect the structure of a particular microelectronic assembly in which one or more substrates or other components as described herein may be included.

Furthermore, the operations illustrated in FIG. 11 may be combined or may include more details than described. For example, the operations may be modified suitably without departing from the scope of the disclosure for IC dies that do not have a semiconductor substrate, but rather, are fabricated on other materials, such as glass or ceramic materials. Still further, the various operations shown and described may further include other manufacturing operations related to fabrication of other components of the microelectronic assemblies described herein, or any devices that may include the microelectronic assemblies as described herein. For example, the operations not shown in the figure may include various cleaning operations, additional surface planarization operations, operations for surface roughening, operations to include barrier and/or adhesion layers as desired, and/or operations for incorporating microelectronic assemblies as described herein in, or with, an IC component, a computing device, or any desired structure or device.

Example Devices and Components

Figure 12:
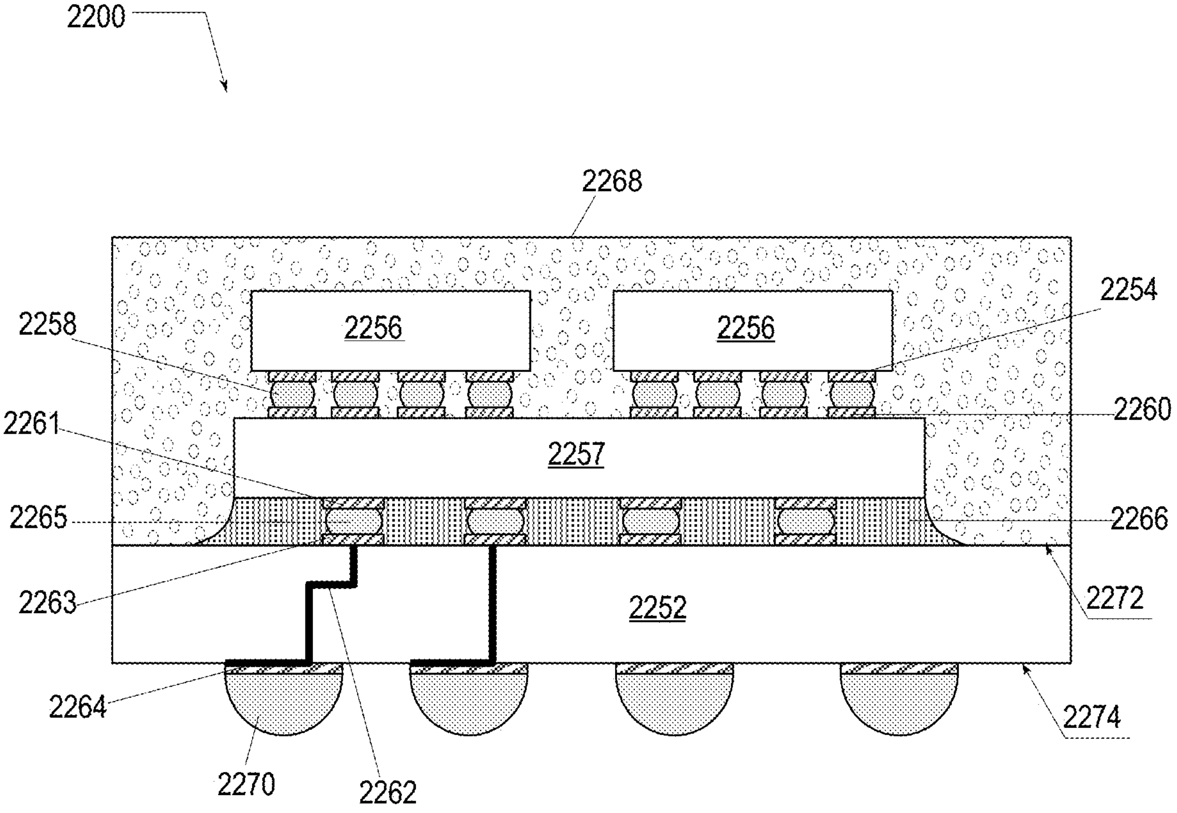
FIG. 12 is a cross-sectional view of a device package that includes one or more microelectronic assemblies in accordance with any of the embodiments disclosed herein.
Figure 13:
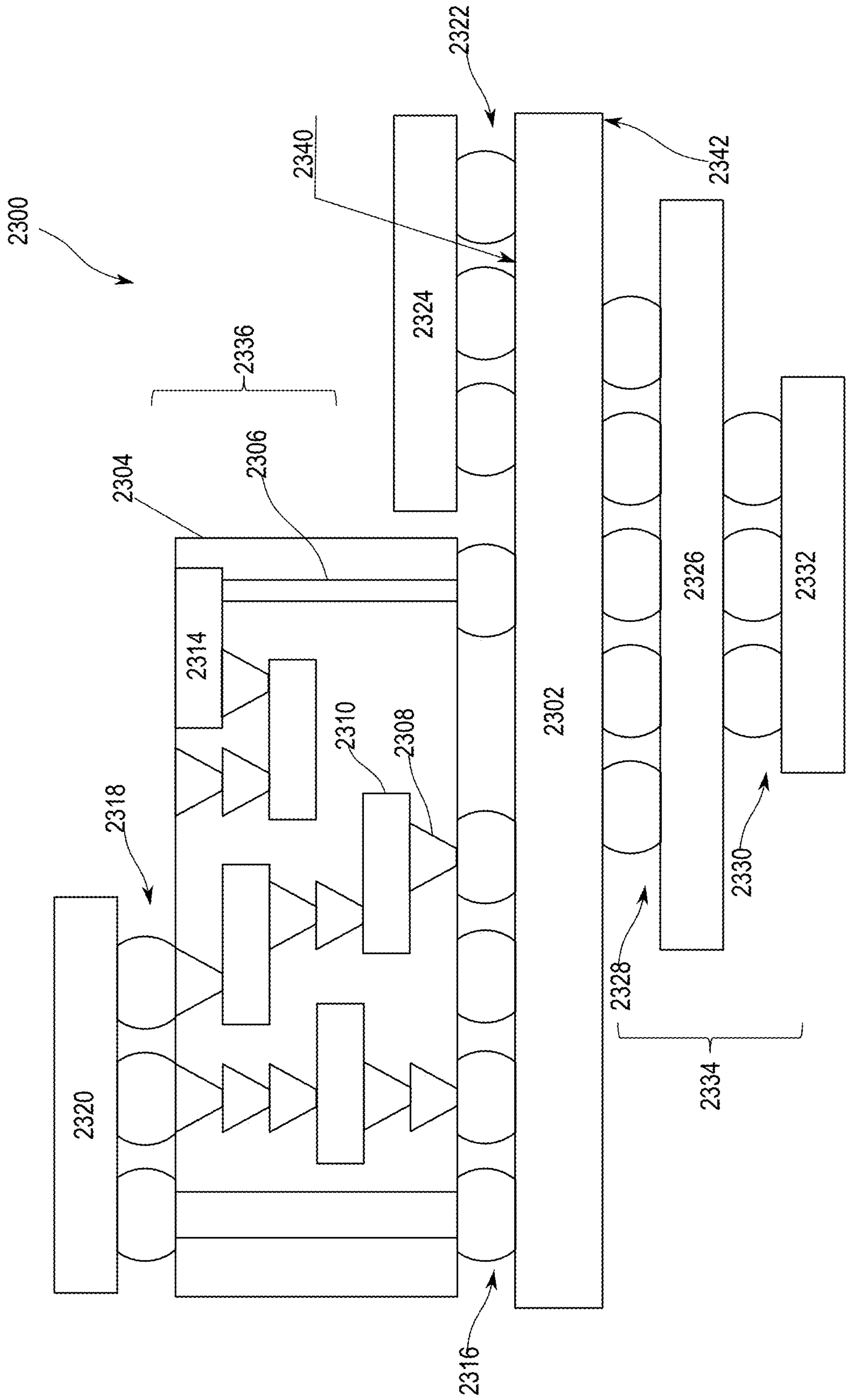
FIG. 13 is a cross-sectional side view of a device assembly that includes one or more microelectronic assemblies in accordance with any of the embodiments disclosed herein.
Figure 14:
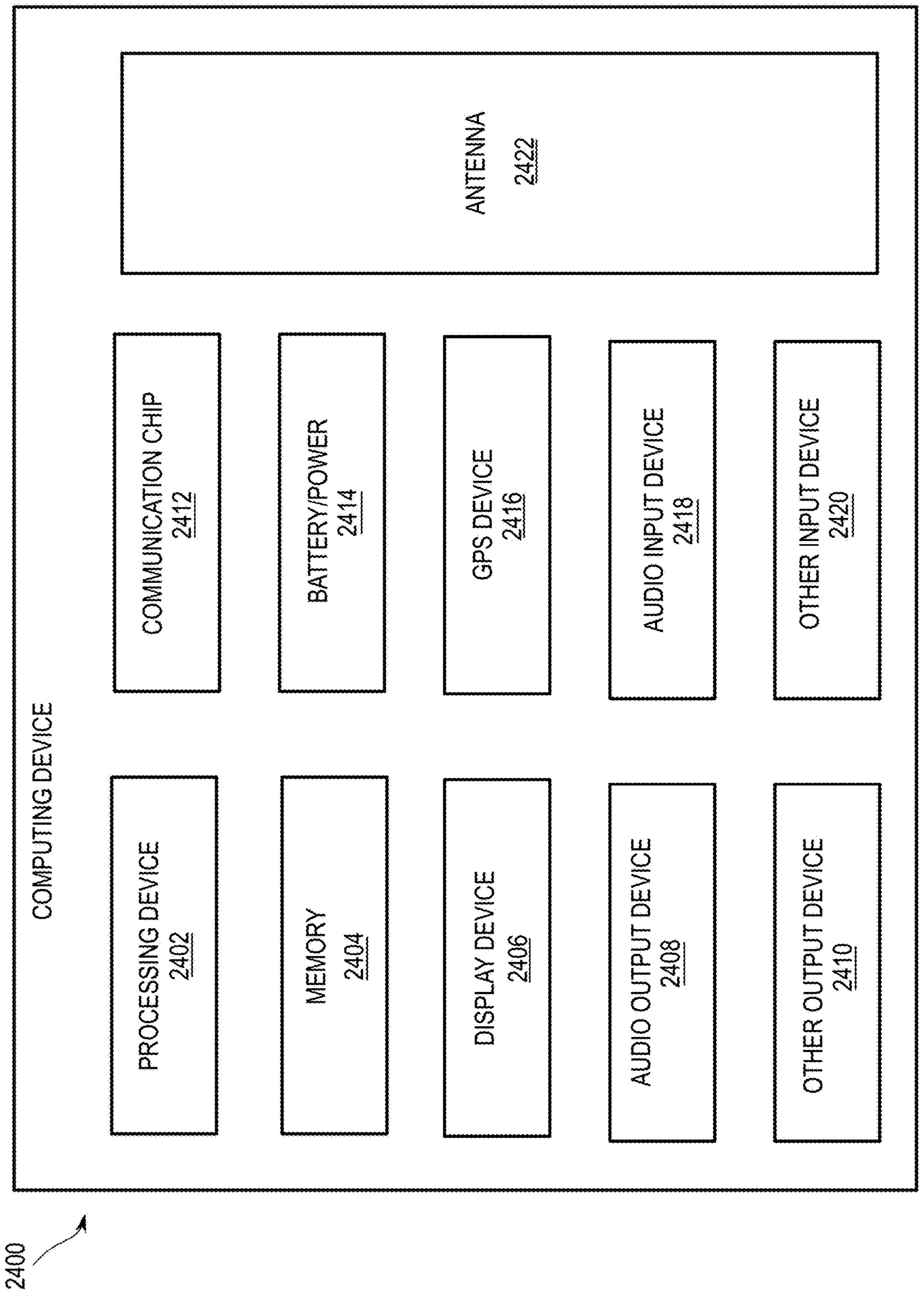
FIG. 14 is a block diagram of an example computing device that includes one or more microelectronic assemblies in accordance with any of the embodiments disclosed herein.

The packages disclosed herein, e.g., any of the embodiments shown in FIGS. 1-11 or any further embodiments described herein, may be included in any suitable electronic component. FIGS. 12-14 illustrate various examples of packages, assemblies, and devices that may be used with or include any of the IC packages as disclosed herein.

FIG. 12 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 13.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 13 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 12.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 12. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects

2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 14 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 12). In yet another example, any one or more of the components of computing device 2400 may include an IC device assembly 2300 (e.g., as shown in FIG. 13).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

Example 1 provides a microelectronic assembly (e.g., 100, FIG. 1), comprising: a package substrate (e.g., 102), comprising buildup layers (e.g., 104) of an organic dielectric material (e.g., 106) and a plurality of layers of conductive traces (e.g., 108) in the organic dielectric material, the package substrate having a first surface (e.g., 110) and a second surface (e.g., 112) opposite the first surface; and a plurality of IC dies coupled to the package substrate on the first surface, in which: at least one conductive trace (e.g., 122) in the plurality of layers of conductive traces is surrounded by air gap structures (e.g., 126) in the organic dielectric material (e.g., FIGS. 1, 4), and the air gap structures are exposed on the first surface.

Example 2 provides the microelectronic assembly of example 1, in which the air gap structures are approximately between 10 micrometers to 100 micrometers wide.

Example 3 provides the microelectronic assembly of any of examples 1-2, in which: the package substrate comprises solder resist (e.g., 118) on the first surface, the air gap structures are exposed through the solder resist.

Example 4 provides the microelectronic assembly of example 3, in which the at least one conductive trace comprises a microstrip at an interface between the organic dielectric material and the solder resist.

Example 5 provides the microelectronic assembly of any of examples 1-4, in which (e.g., FIGS. 2-4): exposed surfaces of the air gap structures are coated with a passivation layer (e.g., 202).

Example 6 provides the microelectronic assembly of example 5, in which the passivation layer comprises a compound of silicon and nitrogen.

Example 7 provides the microelectronic assembly of any of examples 5-6, in which the passivation layer provides a hermetic seal.

Example 8 provides the microelectronic assembly of any of examples 5-7, in which separate portions of the passivation layer contact the organic dielectric material, solder resist, and the conductive traces.

Example 9 provides the microelectronic assembly of any of examples 1-8, in which (e.g., FIGS. 1-3): a pair of stripline traces in one layer of the plurality of layers of conductive traces is surrounded by the air gap structures, the plurality of layers of conductive traces further comprises a first conductive plate (e.g., 124), and a second conductive plate in layers adjacent to the layer with the pair of stripline traces such that the pair of stripline traces is between the first conductive plate and the second conductive plate, the first conductive plate and the second conductive plate are conductively coupled to a ground connection, the first conductive plate is closer to the first surface than the stripline traces and the second conductive plate, and the air gap structures extend through the first conductive plate.

Example 10 provides the microelectronic assembly of example 9, in which (e.g., FIG. 5) the air gap structures comprise an array of openings through the first conductive plate.

Example 11 provides the microelectronic assembly of any of examples 9-10, in which (e.g., FIG. 3) the air gap structures further extend through the second conductive plate.

Example 12 provides the microelectronic assembly of any of examples 9-11, in which a thickness of the organic dielectric material between the first surface of the package substrate and the stripline traces is approximately between 60 micrometers to 80 micrometers.

Example 13 provides the microelectronic assembly of any of examples 1-12, in which a portion of the organic dielectric material is between the at least one conductive trace and the air gap structures.

Example 14 provides the microelectronic assembly of any of examples 1-13, in which the air gap structures are surrounded at least by the organic dielectric material.

Example 15 provides the microelectronic assembly of any of examples 1-14, in which (e.g., FIG. 5) the air gap structures extend partially along a length of the at least one conductive trace.

Example 16 provides the microelectronic assembly of any of examples 1-15, in which the at least one conductive trace is configured to conduct signals at a frequency greater than 10 GHz.

Example 17 provides the microelectronic assembly of any of examples 1-16, in which: the air gap structures are first air gap structures, the package substrate further comprises bond-pads (e.g., 128) on the second surface, second air gap structures surround at least a subset of the bond-pads, and the second air gap structures are exposed on the second surface.

Example 18 provides the microelectronic assembly of example 17, in which: the package substrate comprises solder resist on the second surface, the second air gap structures are exposed through the solder resist.

Example 19 provides the microelectronic assembly of any of examples 17-18, in which (e.g., FIG. 7) the second air gap structures extend past several ones of the plurality of layers of conductive traces.

Example 20 provides the microelectronic assembly of any of examples 17-19, in which (e.g., FIG. 8) the second air gap structures are bounded by one or more of the conductive traces.

Example 21 provides the microelectronic assembly of any of examples 17-20, in which (e.g., FIG. 9) the second air gap structures comprise ring shaped structures around individual bond-pads.

Example 22 provides the microelectronic assembly of any of examples 17-20, in which (e.g., FIG. 9) the second air gap structures comprise partial-ring-shaped structures around individual bond-pads.

Example 23 provides the microelectronic assembly of any of examples 17-20, in which (e.g., FIG. 9) the second air gap structures comprise slots adjacent to individual bond-pads.

Example 24 provides the microelectronic assembly of any of examples 17-20, in which (e.g., FIG. 10) a single one of the second air gap structures surrounds more than one bond-pad.

Example 25 provides the microelectronic assembly of any of examples 17-24, in which: the bond-pads are conductively coupled to signal lines, adjacent bond-pads are conductively coupled to ground, and the adjacent bond-pads are not surrounded by the second air gap structures.

Example 26 provides the microelectronic assembly of any of examples 1-25, in which: the buildup layers are first buildup layers, the package substrate further comprises a core and second buildup layers, the first buildup layers and the second buildup layers are on opposite sides of the core.

Example 27 provides the microelectronic assembly of example 26, in which plated through-hole vias (e.g., 116) through the core conductively couple conductive traces in the first buildup layers and the second buildup layers.

Example 28 provides a package substrate, comprising: an organic dielectric material; a conductive trace in the organic dielectric material; a first air gap structure; and a second air gap structure laterally parallel to the first air gap structure, in which: the conductive trace is proximate and parallel to a surface of the package substrate, the conductive trace is between the first air gap structure and the second air gap structure, the first air gap structure and the second air gap structure are exposed on the surface of the package substrate, and the first air gap structure and the second air gap structure extend orthogonal to the surface of package substrate into the organic dielectric material.

Example 29 provides the package substrate of example 28, in which the first air gap structure and the second air gap structure comprise a plurality of open blind vias arranged in respective rows parallel to the conductive trace and extending along a length of the conductive trace.

Example 30 provides the package substrate of example 28, in which the first air gap structure and the second air gap structure comprise respective open trench vias extending partially along a length of the conductive trace.

Example 31 provides the package substrate of any of examples 28-30, in which at least some surfaces of the first air gap structure and the second air gap structure are covered by a passivation layer of a compound comprising silicon and nitrogen.

Example 32 provides the package substrate of any of examples 28-31, further comprising a ground plane, in which the conductive trace is configured as a microstrip with the conductive trace more proximate to the surface of the package substrate than the ground plane.

Example 33 provides the package substrate of example 32, in which: the organic dielectric material is a first organic dielectric material, the package substrate further comprises a second organic dielectric material between the first organic dielectric material and the ground plane.

Example 34 provides the package substrate of example 33, in which: the conductive trace is in the first organic dielectric material, and the first air gap structure and the second air gap structure extend orthogonal to the surface of package substrate further into the second organic dielectric material.

Example 35 provides the package substrate of example 33, in which: the conductive trace is in the second organic dielectric material, and the first air gap structure and the second air gap structure extend orthogonal to the surface of package substrate further into the second organic dielectric material.

Example 36 provides the package substrate of any of examples 28-31, in which: the conductive trace is a first conductive trace, the package substrate further comprises: a second conductive trace in the organic dielectric material, the second conductive trace being laterally adjacent and parallel to the first conductive trace; and a third air gap structure laterally parallel to the first air gap structure and the second air gap structure, the second conductive trace is proximate and parallel to a surface of the package substrate, the second conductive trace is between the second air gap structure and the third air gap structure, the third air gap structure is exposed on the surface of the package substrate, and the third air gap structure extends orthogonal to the surface of package substrate into the organic dielectric material.

Example 37 provides the package substrate of example 36, in which: the package substrate further comprises a first ground plane and a second ground plane, and the first conductive trace and the second conductive trace are configured as edge-coupled striplines with the first conductive trace and the second conductive trace between the first ground plane and the second ground plane.

Example 38 provides the package substrate of any of examples 36-37, in which the third air gap structure comprises a plurality of open blind vias arranged in a row parallel to and extending partially along respective lengths of the first conductive trace and the second conductive trace.

Example 39 provides the package substrate of any of examples 36-37, in which the third air gap structure comprises an open trench via extending partially along a length of the first conductive trace and the second conductive trace.

Example 40 provides a package substrate, comprising: an organic dielectric material; a conductive bond-pad on a surface of the package substrate; and an air gap structure surrounding the conductive bond-pad, in which: the air gap structure is exposed on the surface of the package substrate, and the air gap structure extends orthogonal to the surface of package substrate into the organic dielectric material.

Example 41 provides the package substrate of example 40, in which the air gap structure comprises an open blind via terminating in the organic dielectric material.

Example 42 provides the package substrate of example 40, in which the air gap structure comprises an open blind via terminating at a conductive trace in the organic dielectric material.

Example 43 provides the package substrate of any of examples 40-42, in which: the organic dielectric material is a first organic dielectric material, the package substrate further comprises a second organic dielectric material surrounding the conductive bond-pad on the surface of the package substrate, and the air gap structure extends through the second organic dielectric material.

Example 44 provides the package substrate of any of examples 40-43, in which: the first organic dielectric material is a polyimide or buildup film, and the second organic dielectric material is solder resist.

Example 45 provides the package substrate of any of examples 40-44, in which: the conductive bond-pad is among a first subset of a plurality of conductive bond-pads, the first subset of the plurality of conductive bond-pads is conductively coupled to a signal connection, and a second subset of the plurality of conductive bond-pads is conductively coupled to a ground connection.

Example 46 provides the package substrate of example 45, in which: individual ones of the second subset of the plurality of conductive bond-pads surround individual ones of the first subset of the plurality of conductive bond-pads, and the package substrate further comprises a plurality of the air gap structures surrounding individual ones in the first subset of the plurality of conductive bond-pads.

Example 47 provides the package substrate of example 45, in which: at least two conductive bond-pads of the first subset of conductive bond-pads are laterally adjacent to each other, and collectively surrounded by individual ones of the second subset of the plurality of conductive bond-pads, and the package substrate further comprises another air gap structure surrounding the at least two conductive bond-pads.

Example 48 provides a method, comprising: providing a package substrate including: organic dielectric material; stripline traces and ground planes proximate to a first surface of the package substrate; and bond-pads proximate to an opposing second surface of the package substrate; cutting a first set of blind vias through the organic dielectric material around the stripline traces; depositing a passivation layer on surfaces of the vias; and cutting a second set of blind vias through the organic dielectric material around the bond-pads.

Example 49 provides the method of example 48, further comprising extending the first set of vias through at least one ground plane.

Example 50 provides the method of any of examples 48-49, in which cutting the first set of blind vias and cutting the second set of blind vias comprises laser drilling.

Example 51 provides the method of any of examples 48-49, in which cutting the first set of blind vias and cutting the second set of blind vias comprises photolithographic etching.

Example 52 provides the method of any of examples 48-51, in which the passivation layer is deposited by PVD.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:

a package substrate, comprising buildup layers of an organic dielectric material and a plurality of layers of conductive traces in the organic dielectric material, the package substrate having a first surface and a second surface opposite the first surface; and a plurality of integrated circuit (IC) dies coupled to the package substrate on the first surface, wherein:

at least one conductive trace in the plurality of layers of conductive traces is surrounded by air gap structures in the organic dielectric material, and the air gap structures are exposed on the first surface.

2. The microelectronic assembly of claim 1, wherein: exposed surfaces of the air gap structures are coated with a passivation layer.

3. The microelectronic assembly of claim 1, wherein:

a pair of stripline traces in one layer of the plurality of layers of conductive traces is surrounded by the air gap structures, the plurality of layers of conductive traces further comprises a first conductive plate, and a second conductive plate in layers adjacent to the layer with the pair of stripline traces such that the pair of stripline traces is between the first conductive plate and the second conductive plate, the first conductive plate and the second conductive plate are conductively coupled to a ground connection, the first conductive plate is closer to the first surface than the stripline traces and the second conductive plate, and the air gap structures extend through the first conductive plate.

4. The microelectronic assembly of claim 3, wherein the air gap structures comprise an array of openings through the first conductive plate.

5. The microelectronic assembly of claim 3, wherein the air gap structures further extend through the second conductive plate.

6. The microelectronic assembly of claim 1, wherein:
the air gap structures are first air gap structures,
the package substrate further comprises bond-pads on the second surface,
second air gap structures surround at least a subset of the bond-pads, and
the second air gap structures are exposed on the second surface.

7. The microelectronic assembly of claim 6, wherein the second air gap structures are bounded by one or more of the conductive traces.

8. The microelectronic assembly of claim 6, wherein:
the bond-pads are conductively coupled to signal lines,
adjacent bond-pads are conductively coupled to ground, and
the adjacent bond-pads are not surrounded by the second air gap structures.

9. A package substrate, comprising:
an organic dielectric material;
a conductive trace in the organic dielectric material;
a first air gap structure; and
a second air gap structure laterally parallel to the first air gap structure,
wherein:
the conductive trace is proximate and parallel to a surface of the package substrate,
the conductive trace is between the first air gap structure and the second air gap structure,
the first air gap structure and the second air gap structure are exposed on the surface of the package substrate,
the first air gap structure and the second air gap structure extend orthogonal to the surface of package substrate into the organic dielectric material, and
the first air gap structure and the second air gap structure comprise a plurality of open blind vias arranged in respective rows parallel to the conductive trace and extending along a length of the conductive trace.

10. The package substrate of claim 9, wherein the first air gap structure and the second air gap structure comprise respective open trench vias extending partially along a length of the conductive trace.

11. A package substrate, comprising:
an organic dielectric material;
a conductive trace in the organic dielectric material;
a first air gap structure; and
a second air gap structure laterally parallel to the first air gap structure,
wherein:
the conductive trace is proximate and parallel to a surface of the package substrate,
the conductive trace is between the first air gap structure and the second air gap structure,
the first air gap structure and the second air gap structure are exposed on the surface of the package substrate,
the first air gap structure and the second air gap structure extend orthogonal to the surface of package substrate into the organic dielectric material, and
at least some surfaces of the first air gap structure and the second air gap structure are covered by a passivation layer of a compound comprising silicon and nitrogen.

12. A package substrate, comprising:
an organic dielectric material;
a conductive trace in the organic dielectric material;
a first air gap structure; and
a second air gap structure laterally parallel to the first air gap structure,
wherein:
the conductive trace is proximate and parallel to a surface of the package substrate,
the conductive trace is between the first air gap structure and the second air gap structure,
the first air gap structure and the second air gap structure are exposed on the surface of the package substrate,
the first air gap structure and the second air gap structure extend orthogonal to the surface of package substrate into the organic dielectric material,
the package substrate further comprises a ground plane, and
the conductive trace is configured as a microstrip, the conductive trace being more proximate to the surface of the package substrate than the ground plane.

13. A package substrate, comprising:
an organic dielectric material;
a conductive trace in the organic dielectric material;
a first air gap structure; and
a second air gap structure laterally parallel to the first air gap structure,
wherein:
the conductive trace is proximate and parallel to a surface of the package substrate,
the conductive trace is between the first air gap structure and the second air gap structure,
the first air gap structure and the second air gap structure are exposed on the surface of the package substrate,
the first air gap structure and the second air gap structure extend orthogonal to the surface of package substrate into the organic dielectric material,
the conductive trace is a first conductive trace, and
the package substrate further comprises:
a second conductive trace in the organic dielectric material, the second conductive trace being laterally adjacent and parallel to the first conductive trace; and
a third air gap structure laterally parallel to the first air gap structure and the second air gap structure,
the second conductive trace is proximate and parallel to a surface of the package substrate,
the second conductive trace is between the second air gap structure and the third air gap structure,
the third air gap structure is exposed on the surface of the package substrate, and
the third air gap structure extends orthogonal to the surface of package substrate into the organic dielectric material.

14. The package substrate of claim 13, wherein:
the package substrate further comprises a first ground plane and a second ground plane, and
the first conductive trace and the second conductive trace are configured as edge-coupled striplines with the first conductive trace and the second conductive trace between the first ground plane and the second ground plane.

15. A package substrate, comprising:
an organic dielectric material;
a conductive bond-pad on a surface of the package substrate; and
an air gap structure surrounding the conductive bond-pad,
wherein:

the air gap structure is exposed on the surface of the package substrate, the air gap structure extends orthogonal to the surface of package substrate into the organic dielectric material, the conductive bond-pad is among a first subset of a plurality of conductive bond-pads, the first subset of the plurality of conductive bond-pads is conductively coupled to a signal connection, and a second subset of the plurality of conductive bond-pads is conductively coupled to a ground connection.

16. The package substrate of claim 15, wherein the air gap structure comprises an open blind via terminating in the organic dielectric material.

17. The package substrate of claim 15, wherein the air gap structure comprises an open blind via terminating at a conductive trace in the organic dielectric material.

18. The package substrate of claim 15, wherein:

individual ones of the second subset of the plurality of conductive bond-pads surround individual ones of the first subset of the plurality of conductive bond-pads, and the package substrate further comprises a plurality of the air gap structures surrounding individual ones in the first subset of the plurality of conductive bond-pads.

* * * * *